United States Patent
Liu et al.

(10) Patent No.: US 10,197,848 B2
(45) Date of Patent: Feb. 5, 2019

(54) ARRAY SUBSTRATE, MANUFACTURING METHOD THEREOF, REPAIRING METHOD THEREOF, DISPLAY PANEL AND DISPLAY DEVICE

(71) Applicants: BOE TECHNOLOGY GROUP CO., LTD., Beijing (CN); BEIJING BOE DISPLAY TECHNOLOGY CO., LTD., Beijing (CN)

(72) Inventors: Huishuang Liu, Beijing (CN); Mingxuan Liu, Beijing (CN); Zengbiao Sun, Beijing (CN); Liping Luo, Beijing (CN); Huali Yao, Beijing (CN)

(73) Assignees: BOE TECHNOLOGY GROUP CO., LTD. (CN); BEIJING BOE DISPLAY TECHNOLOGY CO., LTD. (CN)

( * ) Notice: Subject to any disclaimer, the term of this patent is extended or adjusted under 35 U.S.C. 154(b) by 0 days.

(21) Appl. No.: 15/651,070

(22) Filed: Jul. 17, 2017

(65) Prior Publication Data
US 2018/0024400 A1    Jan. 25, 2018

(30) Foreign Application Priority Data
Jul. 25, 2016    (CN) .......................... 2016 1 0590824

(51) Int. Cl.
| | |
|---|---|
| H01L 27/12 | (2006.01) |
| H01L 21/268 | (2006.01) |
| G02F 1/1368 | (2006.01) |
| G02F 1/1362 | (2006.01) |
| G02F 1/1335 | (2006.01) |
| H01L 21/66 | (2006.01) |

(Continued)

(52) U.S. Cl.
CPC ...... *G02F 1/133553* (2013.01); *G02F 1/1309* (2013.01); *G02F 1/1343* (2013.01); *G02F 1/1368* (2013.01); *G02F 1/136213* (2013.01); *G02F 1/136259* (2013.01); *H01L 21/76894* (2013.01); *H01L 22/00* (2013.01); *H01L 27/124* (2013.01); *H01L 27/1259* (2013.01); *G02F 2001/134318* (2013.01); *G02F 2001/134381* (2013.01); *G02F 2201/508* (2013.01)

(58) Field of Classification Search
CPC . H01L 21/76894; H01L 21/268; H01L 22/00; H01L 27/124; H01L 27/1259; G02F 1/1368; G02F 1/136259; G02F 1/136286; G02F 1/1343; G02F 1/133345; G02F 1/133553
USPC ..... 257/59, 72, 204, 676, E21.596, E27.111, 257/E33.001; 349/55, 139, 143, 144, 349/187, 192; 438/4
See application file for complete search history.

(56) References Cited

U.S. PATENT DOCUMENTS

| | | | |
|---|---|---|---|
| 2014/0176891 A1* | 6/2014 | Hisada | ............ G02F 1/136209 349/139 |
| 2015/0153598 A1* | 6/2015 | Morishima | ......... H01L 27/1259 349/43 |
| 2016/0211275 A1* | 7/2016 | Murakami | ............ H01L 27/124 |

* cited by examiner

*Primary Examiner* — Dao H Nugyen
(74) *Attorney, Agent, or Firm* — Brooks Kushman P.C.

(57) ABSTRACT

The present disclosure provides an array substrate, a manufacturing method thereof, a repairing method thereof, a display panel and a display device. The array substrate includes a base substrate, and a pixel electrode and a common electrode superimposed one on another on the base substrate. An electrically conductive layer is arranged at a region where the pixel electrode and the common electrode (Continued)

overlap each other. The electrically conductive layer is at least insulated from one of the pixel electrode and the common electrode.

15 Claims, 3 Drawing Sheets

(51) Int. Cl.
*H01L 21/768* (2006.01)
*G02F 1/1343* (2006.01)
*G02F 1/13* (2006.01)

ARRAY SUBSTRATE, MANUFACTURING METHOD THEREOF, REPAIRING METHOD THEREOF, DISPLAY PANEL AND DISPLAY DEVICE

CROSS-REFERENCE TO RELATED APPLICATION

The present application claims a priority of the Chinese Patent Application No. 201610590824.8 filed on Jul. 25, 2016, which is incorporated herein by reference in its entirety.

TECHNICAL FIELD

The present disclosure relates to the field of display technology, in particular to an array substrate, a manufacturing method thereof, a repairing method thereof, a display panel and a display device.

BACKGROUND

During the manufacture of a thin film transistor liquid crystal display (TFT-LCD), various defects may occur for a TFT array substrate due to a manufacture process. One of these defects is pixel defect, i.e., dark and bright spots. Because a visual effect is less affected by the dark spot while more affected by the bright spot, it is necessary to perform spot elimination on the defective pixel where the bright spot occurs. However, in the related art, it is impossible to achieve an excellent effect in the case of performing the spot elimination.

SUMMARY

An object of the present disclosure is to provide an array substrate, a manufacturing method thereof, a repairing method thereof, a display panel and a display device, so as to improve the spot elimination effect.

In one aspect, the present disclosure provides in some embodiments an array substrate including a base substrate, a pixel electrode and a common electrode superimposed one on another on the base substrate; and an electrically conductive layer arranged at a region where the pixel electrode and the common electrode overlap each other. The electrically conductive layer is at least insulated from one of the pixel electrode and the common electrode.

In a possible embodiment of the present disclosure, the electrically conductive layer is made of metal or a metal oxide.

In a possible embodiment of the present disclosure, the metal oxide is a transparent metal oxide.

In a possible embodiment of the present disclosure, the metal is molybdenum, aluminium or an alloy thereof, and the transparent metal oxide is indium tin oxide (ITO).

In a possible embodiment of the present disclosure, the electrically conductive layer is located at a non-display region.

In a possible embodiment of the present disclosure, the non-display region is an edge region of the pixel electrode shielded by a black matrix.

In a possible embodiment of the present disclosure, the array substrate further includes a first insulation layer and a second insulation layer superimposed one on another between the pixel electrode and the common electrode, and the electrically conductive layer is arranged between the first insulation layer and the second insulation layer.

In a possible embodiment of the present disclosure, the array substrate further includes a gate electrode, a source electrode and a drain electrode, and the electrically conductive layer is created from a layer identical to the source electrode and the drain electrode, or identical to the gate electrode.

In a possible embodiment of the present disclosure, the electrically conductive layer is configured to be melted using a laser beam to connect the pixel electrode to the common electrode.

In another aspect, the present disclosure provides in some embodiments a method for manufacturing an array substrate, including a step of forming a pixel electrode, an electrically conductive layer and a common electrode on a base substrate. The electrically conductive layer is arranged on the base substrate at a region where the pixel electrode and the common electrode overlap each other, and the electrically conductive layer is at least insulated from one of the pixel electrode and the common electrode.

In yet another aspect, the present disclosure provides in some embodiments a method for repairing an array substrate, including steps of: detecting a defective pixel on the above-mentioned array substrate where a bright spot occurs; and performing laser treatment on a region where the electrically conductive layer in the detected defective pixel is located to melt the electrically conductive layer, thereby to connect the pixel electrode to the common electrode.

In still yet another aspect, the present disclosure provides in some embodiments a display panel including the above-mentioned array substrate.

In still yet another aspect, the present disclosure provides in some embodiments a display device including the above-mentioned display panel.

According to the array substrate, the manufacturing method thereof, the repairing method thereof, the display panel and the display device in the embodiments of the present disclosure, due to the additional electrically conductive layer at the region where the pixel electrode and the common electrode overlap each other, it is able to, in the case of performing spot elimination on the array substrate, melt the electrically conductive layer using a laser beam, so as to connect the pixel electrode to the common electrode. As a result, it is able to improve the spot elimination effect, thereby to improve the yield of the product.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

Figure 1:
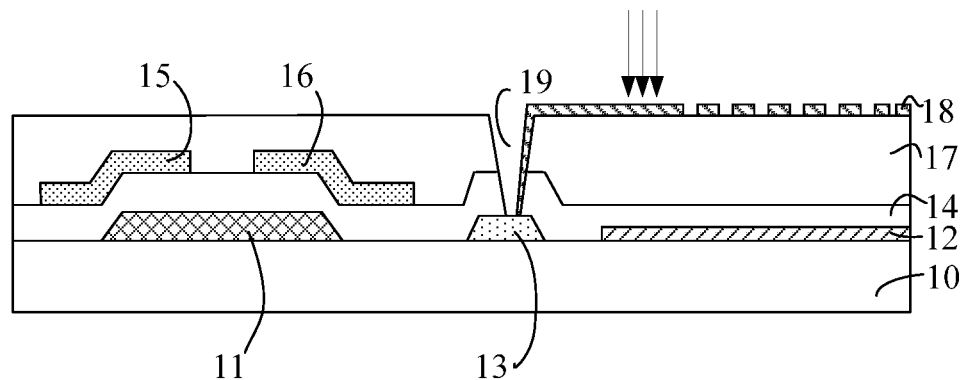
FIG. 1 is a schematic view showing an array substrate of a High Transmittance Advanced Super Dimension Switch (HADS) display mode.

In the related art, in the case of performing spot elimination on defective pixels where bright spots occur, a bad effect may be achieved. FIG. 1 shows a TFT array substrate, which includes: a base substrate 10; a gate electrode 11, a pixel electrode 12 and a common electrode line 13 arranged on the base substrate 10 and separated from each other; a gate insulation layer 14 covering the base substrate 10, the gate electrode 11, the pixel electrode 12 and the common electrode line 13; a source electrode 15 and a drain electrode 16 arranged on the gate insulation layer 14; a passivation layer 17 covering the source electrode 15 and the drain electrode 16; and a common electrode 18 arranged on the passivation layer 17 and above the pixel electrode 12, and electrically connected to the common electrode line 13 through a via-hole 19. For the TFT array substrate, in the case that the bright spot occurs for a certain pixel for some reasons, the pixel needs to be repaired. During the repairing, the pixel electrode 12 may be welded at a high temperature to the common electrode 18 using a laser beam (as shown by an arrow in FIG. 1). However, sizes and thickness of the pixel electrode 12 and the common electrode 18 at a pixel region are limited, and after the welding operation, it is insufficient for the pixel electrode 12 and the common electrode 18 to connect to each other in a better manner. As a result, a bad spot elimination effect may be achieved.

To overcome this defect, the present disclosure provides in some embodiments an array substrate, which includes a base substrate, and a pixel electrode and a common electrode superimposed one on another on the base substrate. An electrically conductive layer is arranged at a region where the pixel electrode and the common electrode overlap each other. The electrically conductive layer is at least insulated from one of the pixel electrode and the common electrode. The region here refers to a region where orthogonal projections of the pixel electrode and the common electrode onto the base substrate overlap each other.

In a possible embodiment of the present disclosure, the pixel electrode, the electrically conductive layer and the common electrode may be arranged on the base substrate sequentially, or the common electrode, the electrically conductive layer and the pixel electrode may be arranged on the base substrate sequentially.

In a possible embodiment of the present disclosure, in the case that a pixel is defective and a bright spot occurs, the electrically conductive layer is used to be melted using a laser beam to connect the pixel electrode to the common electrode.

According to the embodiments of the present disclosure, due to the additional electrically conductive layer at the region where the pixel electrode and the common electrode overlap each other, it is able to, in the case of performing spot elimination on the array substrate, melt the electrically conductive layer using the laser beam, so as to connect the pixel electrode to the common electrode. As a result, it is able to improve the spot elimination effect, thereby to improve the yield of the product.

The present disclosure will be described hereinafter in conjunction with the drawings and embodiments. A thickness and a shape of each layer in the drawings are for illustrative purposes only, but shall not be used to reflect an actual scale.

In the embodiments of the present disclosure, the electrically conductive layer is at least insulated from one of the pixel electrode and the common electrode, so three structures may be provided. As a first one, the electrically conductive layer may be electrically connected to the common electrode and insulated from the pixel electrode. As a second one the electrically conductive layer may be electrically connected to the pixel electrode and insulated from the common electrode. As a third one, the electrically conductive layer may be insulated from both of the common electrode and the pixel electrode. These three structures will be described hereinafter in conjunction with the drawings.

Figure 2:
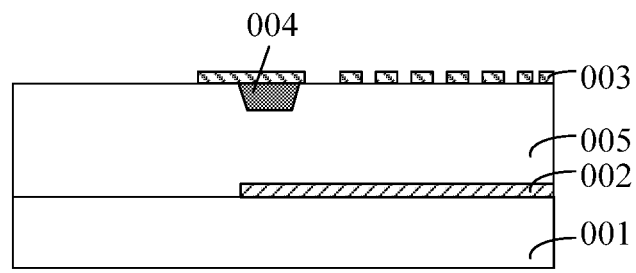
FIG. 2 is a schematic view showing an array substrate according to one embodiment of the present disclosure.

First structure where the electrically conductive layer is electrically connected to the common electrode and insulated from the pixel electrode As shown in FIG. 2, the array substrate includes the base substrate 001, and the pixel electrode 002 and the common electrode 003 arranged sequentially on the base substrate 001. The electrically conductive layer 004 is arranged at a region where the pixel electrode 002 and the common electrode 003 overlap each other. In the case that a pixel is defective and a bright spot occurs, the electrically conductive layer 004 is configured to be melted using a laser beam to connect the pixel electrode 002 to the common electrode 003. The array substrate further includes a first insulation layer 005 arranged between the electrically conductive layer 004 and the pixel electrode 002 and between the common electrode 003and the pixel electrode 002, and configured to enable the electrically conductive layer 004 to be insulated from the pixel electrode 002.

In order to provide the common electrode 003 with a flat surface, in some embodiments of the present disclosure, the electrically conductive layer 004 is arranged at a recess region of the first insulation layer 005 so that an upper surface of the electrically conductive layer 004 to be flush with an upper surface of the first insulation layer 005.

Figure 3:
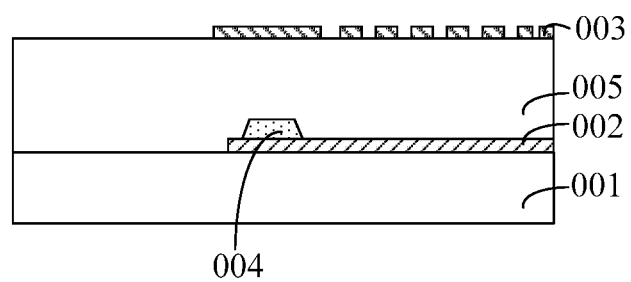
FIG. 3 is another schematic view showing the array substrate according to one embodiment of the present disclosure.

Second structure where the electrically conductive layer is electrically connected to the pixel electrode and insulated from the common electrode As shown in FIG. 3, the array substrate includes the base substrate 001, and the pixel electrode 002 and the common electrode 003 arranged sequentially on the base substrate 001. The electrically conductive layer 004 is arranged at a region where the pixel electrode 002 and the common electrode 003 overlap each other. In the case that a pixel is defective and a bright spot occurs, the electrically conductive layer 004 is configured to be melted using a laser beam to connect the pixel electrode 002 to the common electrode 003. The array substrate further includes the first insulation layer 005 arranged between the electrically conductive layer 004 and the common electrode 003 and between the common electrode 003 and the pixel electrode 002, and configured to enable the electrically conductive layer 004 to be insulated from the common electrode 003. During the manufacture, the first insulation layer 005 may directly cover the electrically conductive layer 004 and an upper surface of the first insulation layer 005 may be flat. At this time, it is unnecessary to provide a recess region, so it is able to simplify the manufacture and reduce the production cost.

Third structure where the electrically conductive layer 004 is insulated from both of the common electrode 003 and the pixel electrode 002

Figure 4:
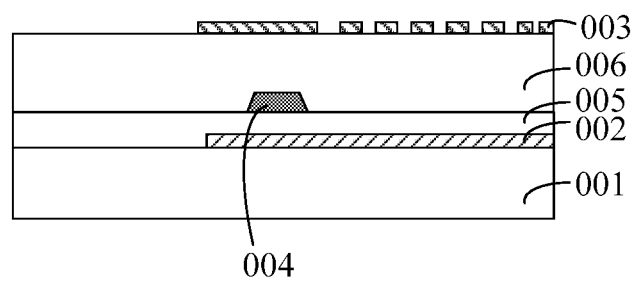
FIG. 4 is yet another schematic view showing the array substrate according to one embodiment of the present disclosure.

As shown in FIG. 4, the array substrate includes the base substrate 001, and the pixel electrode 002 and the common electrode 003 arranged sequentially on the base substrate 001. The electrically conductive layer 004 is arranged at a region where the pixel electrode 002 and the common electrode 003 overlap each other. In the case that a pixel is defective and a bright spot occurs, the electrically conductive layer 004 is configured to be melted using a laser beam to connect the pixel electrode 002 to the common electrode 003. The array substrate further includes the first insulation layer 005 and a second insulation layer 006 arranged one on another between the pixel electrode 002 and the common electrode 003. The electrically conductive layer 004 is arranged between the first insulation layer 005 and the second insulation layer 006. The first insulation layer 005 is configured to enable the electrically conductive layer 004 to be insulated from the pixel electrode 002, and the second insulation layer 006 is configured to enable the electrically conductive layer 004 to be insulated from the common electrode 003.

For the above-mentioned three structures, the pixel electrode, the electrically conductive layer and the common electrode are arranged sequentially on the base substrate. In the case that the common electrode, the electrically conductive layer and the pixel electrode are arranged sequentially on the base substrate, the implementation of the array substrate may refer to those mentioned above and thus will not be particularly defined herein.

In a possible embodiment of the present disclosure, the electrically conductive layer may be made of metal, a metal oxide, or any other appropriate electrically conductive material. The metal may be molybdenum (Mo) or aluminium (Al). The metal may be a transparent metal, and the metal oxide may be a transparent metal oxide, so as to provide the transparent electrically conductive layer, thereby to prevent an aperture ratio from being adversely affected by the electrically conductive layer. The transparent metal oxide may be ITO.

In some embodiments of the present disclosure, the electrically conductive layer may be arranged at a non-display region, so as to further prevent the aperture ratio of a pixel unit from being adversely affected by the electrically conductive layer. The non-display region refers to an edge region of the pixel electrode shielded by a black matrix.

It should be appreciated that, in the embodiments of the present disclosure, a thickness of the electrically conductive layer may be set in accordance with the practical need, and a size of an orthogonal projection of the electrically conductive layer onto the base substrate may also be set in accordance with the practical need.

The array substrate may be a TFT array substrate, and a TFT may be of a top-gate or bottom-gate type. In some embodiments of the present disclosure, the array substrate further includes a gate electrode, a source electrode and a drain electrode. The electrically conductive layer may be created from a layer identical to the source electrode and the drain electrode, or identical to the gate electrode.

To be specific, in the case of a bottom-gate TFT, the electrically conductive layer may be created from a layer identical to the source electrode and the drain electrode, and in the case of a top-gate TFT, the electrically conductive layer may be created from a layer identical to the gate electrode. In the embodiments of the present disclosure, in the case of manufacturing the top-gate TFT, the gate electrode and the electrically conductive layer may be formed simultaneously, or in the case of manufacturing the bottom-gate TFT, the source electrode, the drain electrode and the electrically conductive layer may be formed simultaneously, so as to simplify the manufacture process.

The array substrate in the embodiments of the present disclosure will be described hereinafter in more details by taking the bottom-gate TFT as an example.

Figure 5:
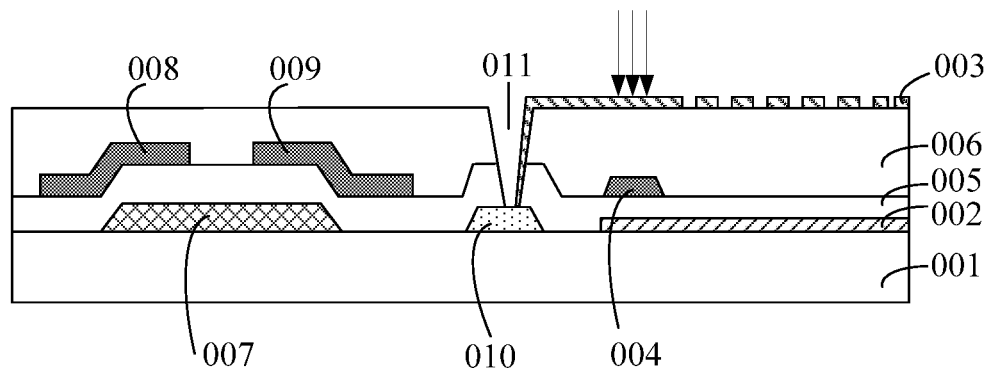
FIG. 5 is still yet another schematic view showing the array substrate according to one embodiment of the present disclosure.

As shown in FIG. 5, the array substrate includes: the base substrate 001; the gate electrode 007, the pixel electrode 002 and a common electrode line 010 arranged on the base substrate 001 and separated from each other; the first insulation layer 005 covering the base substrate 001, the gate electrode 007, the pixel electrode 002 and the common electrode line 010; the source electrode 008, the drain electrode 009 and the electrically conductive layer 004 arranged on the first insulation layer 005; the second insulation layer 006 covering the source electrode 008, the drain electrode 009 and the electrically conductive layer 004; and the common electrode 003 arranged on the second insulation layer 006 and above the pixel electrode 002, and electrically connected to the common electrode line 010 through a via-hole 011 penetrating through the first insulation layer 005 and the second insulation layer 006.

The electrically conductive layer 004 is arranged at a region where the pixel electrode 002 and the common electrode 003 overlap each other, and in the case that a pixel is defective and a bright spot occurs, it is configured to be melted using a laser beam to connect the pixel electrode 002 to the common electrode 003. The electrically conductive layer 004 is made of a material identical to the source electrode 008 and the drain electrode 009. In this way, the electrically conductive layer 004 may be manufactured together with the source electrode 008 and the drain electrode 009, so as to simplify the manufacture process. In addition, the electrically conductive layer 004 is arranged at the non-display region, so as to ensure the aperture ratio of the pixel unit.

According to the array substrate in the embodiments of the present disclosure, in the case of spot elimination, the electrically conductive layer 004 in the defective pixel may be melted using a laser beam (as shown by an arrow in FIG. 5), so as to connect the pixel electrode 002 to the common electrode 003, thereby to improve the spot elimination effect.

Based on an identical inventive concept, the present disclosure further provides in some embodiments a method for manufacturing the array substrate, which at least includes a step of forming the pixel electrode, the electrically conductive layer and the common electrode on the base substrate. The electrically conductive layer is arranged on the base substrate at a region where the pixel electrode and the common electrode overlap each other, and the electrically conductive layer is at least insulated from one of the pixel electrode and the common electrode.

According to the embodiments of the present disclosure, due to the additional electrically conductive layer at the region where the pixel electrode and the common electrode overlap each other, it is able to, in the case of performing spot elimination on the array substrate, melt the electrically conductive layer using a laser beam, so as to connect the pixel electrode to the common electrode. As a result, it is able to improve the spot elimination effect, thereby to improve the yield of the product.

In the case that the electrically conductive layer is merely insulated from the pixel electrode, in some embodiments of the present disclosure, the method may include steps of: forming the pixel electrode on the base substrate; forming the first insulation layer on the base substrate with the pixel electrode; forming the electrically conductive layer on the first insulation layer; and forming the common electrode on the electrically conductive layer. Further, in the case that the electrically conductive layer is arranged at a recess region of the first insulation layer, prior to the step of forming the electrically conductive layer on the first insulation layer, the method further includes forming, by etching, the recess region in the first insulation layer at a region where the pixel electrode and the common electrode overlaps each other. Correspondingly, the step of forming the electrically conductive layer on the first insulation layer may include forming the electrically conductive layer at the recess region of the first insulation layer in such a manner that an upper surface of the electrically conductive layer is flush with an upper surface of the first insulation layer.

In the case that the electrically conductive layer is merely insulated from the common electrode, in some embodiments of the present disclosure, the method may include steps of: forming the pixel electrode on the base substrate; forming the electrically conductive layer on the base substrate with the pixel electrode; forming the first insulation layer on the base substrate with the electrically conductive layer; and forming the common electrode on the first insulation layer.

In the case that the electrically conductive layer is insulated from both of the common electrode and the pixel electrode, in some embodiments of the present disclosure, the method may include steps of: forming the pixel electrode on the base substrate; forming the first insulation layer on the base substrate with the pixel electrode; forming the electrically conductive layer on the first insulation layer; forming the second insulation layer on the electrically conductive layer; and forming the common electrode on the second insulation layer.

In the embodiments of the present disclosure, the array substrate may be a TFT array substrate, so it may further include a gate electrode, a source electrode and a drain electrode. In the case that the electrically conductive layer is insulated from both of the common electrode and the pixel electrode, for the bottom-gate TFT, the method may further include: forming the gate electrode on the base substrate; and forming the source electrode and the drain electrode on the first insulation layer. Correspondingly, the step of forming the electrically conductive layer on the first insulation layer may include forming the source electrode, the drain electrode and the electrically conductive layer on the first insulation layer simultaneously. For the top-gate TFT, the method may further include: forming the source electrode and the drain electrode on the base substrate; and forming the gate electrode on the first insulation layer. Correspondingly, the step of forming the electrically conductive layer on the first insulation layer may include forming the electrically conductive layer and the gate electrode on the first insulation layer simultaneously.

For the above-mentioned method, the pixel electrode, the electrically conductive layer and the common electrode are arranged sequentially on the base substrate. In the case that the common electrode, the electrically conductive layer and the pixel electrode are arranged sequentially on the base substrate, the implementation of the method may refer to that mentioned above and thus will not be particularly defined herein.

The method in the embodiments of the present disclosure will be described hereinafter in more details by taking the bottom-gate TFT as an example.

Figure 6A:
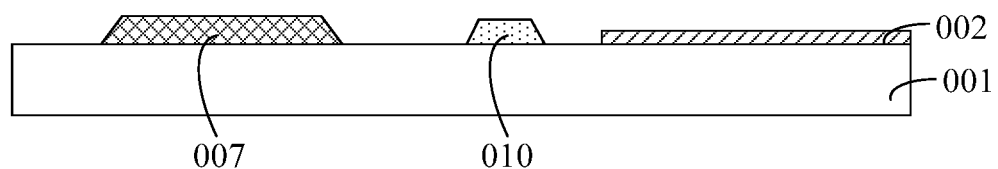
FIGS. 6a to 6e are schematic views showing the manufacture of various members in a method for manufacturing the array substrate according to one embodiment of the present disclosure.

Step 1: as shown in FIG. 6a, the gate electrode 007, the pixel electrode 002 and the common electrode line 010 may be formed on the base substrate 001. The pixel electrode 002 may be made of ITO.

Figure 6B:
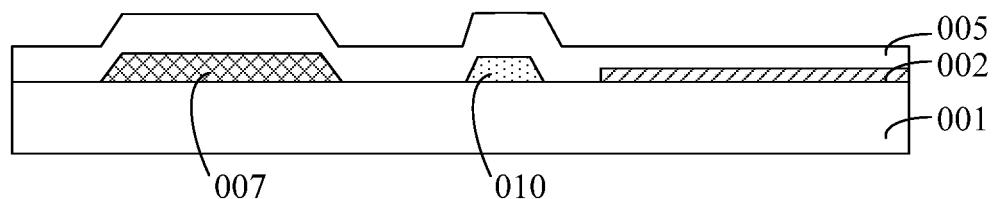

Step 2: as shown in FIG. 6b, the first insulation layer 005 may be formed on the base substrate 001 with the gate electrode 007, the pixel electrode 002 and the common electrode line 010.

Figure 6C:
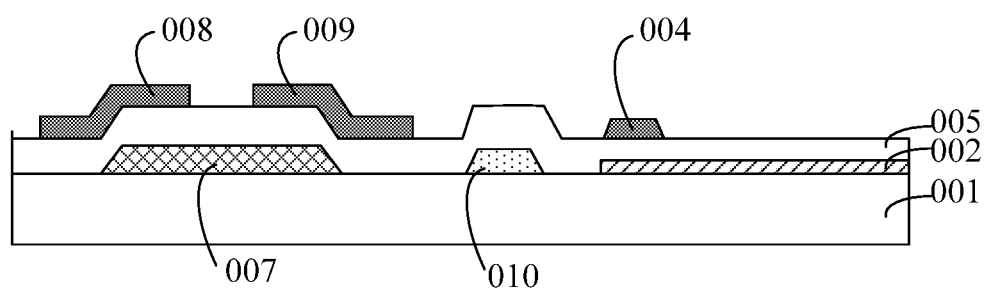

Step 3: as shown in FIG. 6c, the source electrode 008, the drain electrode 009 and the electrically conductive layer 004 may be formed simultaneously on the base substrate 001 with the first insulation layer 005 using a mask plate. The source electrode 008 and the drain electrode 009 may be arranged above the gate electrode, and the electrically conductive layer 004 may be arranged at a region where the pixel electrode 002 and the to-be-formed common electrode overlap each other. The source electrode 008, the drain electrode 009 and the electrically conductive layer 004 may be made of Mo and Al, i.e., a Mo layer, an Al layer and another Mo layer may be arranged sequentially on the base substrate.

Figure 6D:
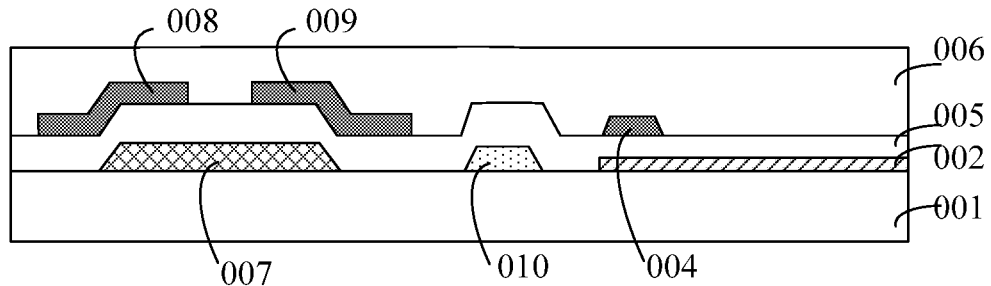

Step 4: as shown in FIG. 6d, the second insulation layer 006 may be formed on the base substrate 001 with the source electrode 008, the drain electrode 009 and the electrically conductive layer 004.

Figure 6E:
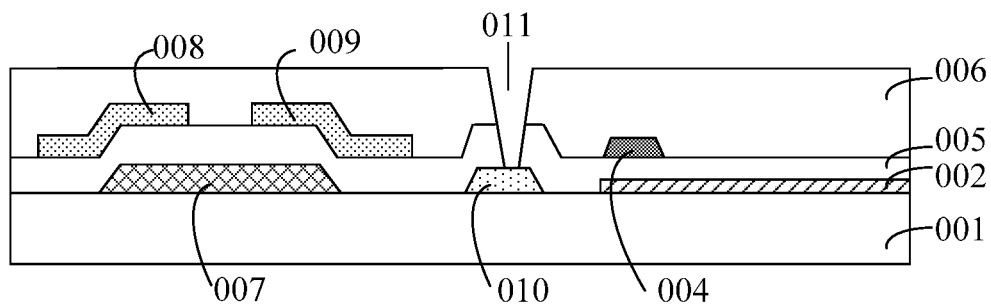

Step 5: as shown in FIG. 6e, the via-hole 011 penetrating through the first insulation layer 005 and the second insulation layer 006 may be formed on the base substrate with the second insulation layer 006.

Step 6: the common electrode 003 may be formed on the second insulation layer 006 and above the pixel electrode 002, and electrically connected to the common electrode line 010 through the via-hole 011, as shown in FIG. 6. The common electrode 003 may be made of ITO.

Figure 7:
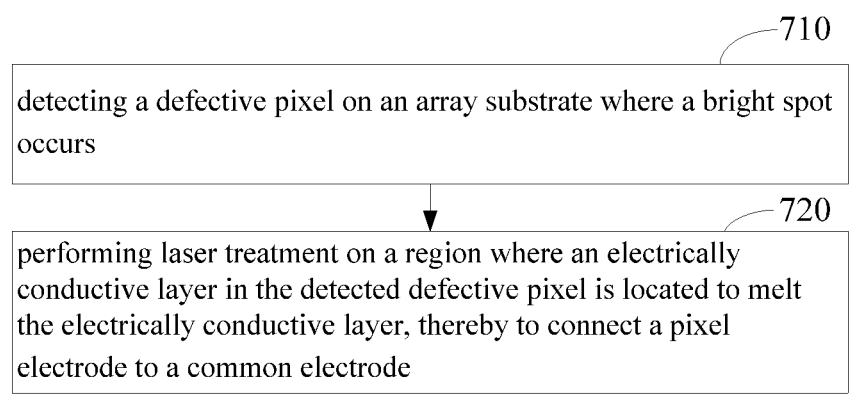
FIG. 7 is a flow chart of a method for repairing the array substrate according to one embodiment of the present disclosure.

Based on an identical inventive concept, the present disclosure further provides in some embodiments a method for repairing the array substrate which, as shown in FIG. 7, at least includes: Step 710 of detecting a defective pixel on the above-mentioned array substrate where a bright spot occurs; and Step 720 of performing laser treatment on a region where the electrically conductive layer in the detected defective pixel is located to melt the electrically conductive layer, thereby to connect the pixel electrode to the common electrode.

According to the embodiments of the present disclosure, due to the additional electrically conductive layer at the region where the pixel electrode and the common electrode overlap each other, it is able to, in the case of performing spot elimination on the array substrate, melt the electrically conductive layer using a laser beam, so as to connect the pixel electrode to the common electrode. As a result, it is able to improve the spot elimination effect, thereby to improve the yield of the product.

Based on an identical inventive concept, the present disclosure further provides in some embodiments a display panel including the above-mentioned array substrate and any other relevant assemblies such as a driver circuit.

Based on an identical inventive concept, the present disclosure further provides in some embodiments a display device including the above-mentioned display panel and any other relevant assemblies such as a power source, a control circuit and an input device (e.g., button and remote controller). The display device may be of, but not limited to, an HADS mode and an ADS mode.

According to the array substrate, the manufacturing method thereof, the repairing method thereof, the display panel and the display device in the embodiments of the present disclosure, due to the additional electrically conductive layer at the region where the pixel electrode and the common electrode overlap each other, it is able to, in the case of performing spot elimination on the array substrate, melt the electrically conductive layer using a laser beam to connect the pixel electrode to the common electrode. As a result, it is able to improve the spot elimination effect, thereby to improve the yield of the product.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising
a base substrate,
a pixel electrode and a common electrode superimposed one on another on the base substrate, and
an electrically conductive layer arranged at a region where the pixel electrode and the common electrode overlap each other, and at least insulated from one of the pixel electrode and the common electrode,
wherein the electrically conductive layer is located at a non-display region, and the non-display region is an edge region of the pixel electrode shielded by a black matrix: and
a first insulation layer and a second insulation layer superimposed one on another between the pixel electrode and the common electrode wherein the electrically conductive layer is arranged between the first insulation layer and the second insulation layer.

2. The array substrate according to claim 1, wherein the electrically conductive layer is made of metal or a metal oxide.

3. The array substrate according to claim 2, wherein the metal is transparent metal, and the metal oxide is a transparent metal oxide.

4. The array substrate according to claim 2, wherein the metal is molybdenum, aluminium or an alloy thereof, and the transparent metal oxide is indium tin oxide (ITO).

5. The array substrate according to claim 1, further comprising a gate electrode, a source electrode and a drain electrode, wherein the electrically conductive layer is created from a layer identical to the source electrode and the drain electrode, or identical to the gate electrode.

6. The array substrate according to claim 1, wherein the electrically conductive layer is configured to be melted using a laser beam to connect the pixel electrode to the common electrode.

7. A method for repairing the array substrate according to claim 1, comprising steps of: detecting a defective pixel on the array substrate where a bright spot occurs; and performing laser treatment on a region where the electrically conductive layer in the detected defective pixel is located to melt the electrically conductive layer to connect the pixel electrode to the common electrode.

8. A display panel comprising the array substrate according to claim 1.

9. The display panel according to claim 8, wherein the electrically conductive layer is made of metal or a metal oxide.

10. The display panel according to claim 9, wherein the metal is molybdenum, aluminium or an alloy thereof, and the metal oxide is indium tin oxide (ITO).

11. The display panel according to claim 8, wherein the array substrate further comprises a first insulation layer and a second insulation layer superimposed one on another between the pixel electrode and the common electrode, and the electrically conductive layer is arranged between the first insulation layer and the second insulation layer.

12. The display panel according to claim 8, wherein the array substrate further comprises a gate electrode, a source electrode and a drain electrode, and the electrically conductive layer is created from a layer identical to the source electrode and the drain electrode, or identical to the gate electrode.

13. The display panel according to claim 8, wherein the electrically conductive layer is configured to be melted using a laser beam to connect the pixel electrode to the common electrode.

14. A display device comprising the display panel according to claim 8.

15. A method for manufacturing an array substrate, comprising a step of forming a pixel electrode, an electrically conductive layer and a common electrode on a base substrate, wherein the electrically conductive layer is arranged on the base substrate at a region where the pixel electrode and the common electrode overlap each other, and the electrically conductive layer is at least insulated from one of the pixel electrode and the common electrode wherein the electrically conductive layer is located at a non-display region, and the non-display region is an edge region of the pixel electrode shielded by a black matrix; and
forming a first insulation layer and a second insulation layer superimposed one on another between the pixel electrode and the common electrode, wherein the electrically conductive layer is arranged between the first insulation layer and the second insulation layer.

* * * * *